United States Patent
Zhang et al.

(10) Patent No.: US 9,559,261 B2
(45) Date of Patent: Jan. 31, 2017

(54) NITRIDE UNDERLAYER AND FABRICATION METHOD THEREOF

(71) Applicant: XIAMEN SANAN OPTOELECTRONICS TECHNOLOGY CO., LTD., Xiamen (CN)

(72) Inventors: Dongyan Zhang, Xiamen (CN); Jie Zhang, Xiamen (CN); Weihua Du, Xiamen (CN); Xiaofeng Liu, Xiamen (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/738,901

(22) Filed: Jun. 14, 2015

(65) Prior Publication Data
US 2015/0280069 A1    Oct. 1, 2015

Related U.S. Application Data

(63) Continuation of application No. PCT/CN2014/071001, filed on Jan. 21, 2014.

(30) Foreign Application Priority Data

Mar. 28, 2013 (CN) .......................... 2013 1 0102866

(51) Int. Cl.
*H01L 33/00* (2010.01)
*H01L 33/32* (2010.01)
*H01L 33/20* (2010.01)
*H01L 33/12* (2010.01)
*H01L 33/18* (2010.01)
*H01L 33/24* (2010.01)

(52) U.S. Cl.
CPC ............. *H01L 33/32* (2013.01); *H01L 33/007* (2013.01); *H01L 33/0075* (2013.01); *H01L 33/12* (2013.01); *H01L 33/18* (2013.01); *H01L 33/20* (2013.01); *H01L 33/24* (2013.01); *H01L 2933/0025* (2013.01)

(58) Field of Classification Search
CPC .......... H01L 33/18; H01L 33/32; H01L 33/24; H01L 33/0075; H01L 33/007; H01L 33/12; H01L 33/20; H01L 2933/0025
See application file for complete search history.

(56) References Cited

U.S. PATENT DOCUMENTS

2008/0272462 A1* 11/2008 Shimamoto ....... H01L 21/02389
                                                    257/615
2010/0102353 A1    4/2010 Park

* cited by examiner

*Primary Examiner* — Su C Kim
(74) *Attorney, Agent, or Firm* — Syncoda LLC; Feng Ma; Junjie Feng (57) ABSTRACT

A nitride layer with embedded hole structure can be used for fabricating GaN-based LED of high external quantum efficiency through epitaxial growth. The approaches can have advantages such as reducing the complexity chip process for forming hole structure, reducing impacts from the chip process on chip reliability, effective reduction of hole structure size and increase of device stability, crush resistance, and reliability. A fabrication method of an underlayer structure with embedded micro-hole structure is also provided.

19 Claims, 8 Drawing Sheets

NITRIDE UNDERLAYER AND FABRICATION METHOD THEREOF

CROSS-REFERENCE TO RELATED APPLICATIONS

The present application is a continuation of, and claims priority to, PCT/CN2014/071001 filed on Jan. 21, 2014, which claims priority to Chinese Patent Application No. 201310102866.9 filed on Mar. 28, 2013. The disclosures of these applications are hereby incorporated by reference in their entirety.

BACKGROUND

Photoelectric devices, e.g., LED, made of nitride material system are widely applied in fields like solid display, lighting and signal light for the band gap of such material can cover entire visible light range. The non-toxic nitride material has such advantages as high luminance, low work voltage and easy for miniaturization. Therefore, replacement of traditional light source with GaN-based LED has become an irreversible trend. However, one of the keys to obtain nitride light emitting device of higher luminous efficiency lies in improvement of photoelectric conversion efficiency and extraction efficiency.

SUMMARY

Various objectives of the present disclosure may include providing a nitride layer with embedded hole structure and fabrication method thereof, in combination with patterned substrate for improving extraction efficiency of GaN-based LED.

According to a first aspect of present disclosure, a fabrication method of nitride underlayer, comprising: 1) providing a pattern substrate with lattice planes of different growth rates; 2) forming a nitride nucleating layer over the pattern substrate; 3) forming a first nitride layer over the nucleating layer under quasi two-dimensional growth conditions; 4) forming a second nitride layer, having a gap with the substrate, over the first nitride layer under three-dimensional growth conditions; 5) continuously growing a third nitride layer over the three-dimensional GaN layer, which folds an uncracked plane above the gap to form a hole structure on the nitride underlayer; wherein, the quasi two-dimensional growth conditions refer to that the ratio between horizontal and vertical growth rates is between those of two-dimensional growth conditions and three-dimensional growth conditions.

In the above method, the first nitride layer grown under quasi two-dimensional conditions, which are between three-dimensional growth and two-dimensional growth, will not form high-density layer-dislocated area; instead, together with pattern substrate, it will provide an island for later three-dimensional growth to achieve dislocation turning and to reduce dislocation density in later growth in combination. In later device fabrication, the first nitride layer can prevent lateral erosion effect by different corrosive liquids on the substrate or the epitaxial layer.

Further, a hole in sub-micron scale is formed over the nitride underlayer and appears discontinuous yet non-strictly periodic distribution surrounding the substrate pattern, which prevents large hole size from influencing device appearance, crushing resistance and stability and makes it easier for later device fabrication.

In some embodiments, the substrate pattern comprises a series of protrusion portions, in circular platform, prism platform, cone, pyramid shapes or their combinations. Preferably, the protrusion portion top appears platform shape, and included angle between the top lattice plane and that of the non-protrusion portion is less than 5°. Relationship of growth rates of different areas of the pattern substrate: non-protrusion portion>protrusion portion top>protrusion portion side wall. In step 2), the first nitride layer is mainly formed in the non-protrusion portion. Further, the protrusion portion is at least 0.5 μm high with preferred gap larger than 0.01 μm.

In some embodiments, the substrate pattern comprising a series of recess portions is an inverted trapezoidal structure with a tilt side wall, wherein, the lattice growth rate of the side wall is slower than that of the bottom lattice plane. In step 3), a first nitride layer through quasi two-dimensional growth, a second nitride layer through three-dimensional growth and a third nitride layer through two-dimensional growth are formed over the recess portion bottom in successive, wherein, the recess portion is at least 0.5 μm deep with preferred gap larger than 0.01 μm and diameter between 0.5 μm and 8 μm.

In the above method, by controlling thicknesses of the first nitride layer and the second nitride layer, the hole structure size can be adjusted. The thicker the first nitride layer is, the smaller the hole is. Preferably, total thickness of the first and the second nitride layers is similar to that of the substrate pattern with difference not more than 0.5 μm. In some embodiments, the first nitride layer formed in step 3) is about 0.1-1.5 μm thick; the second nitride layer formed in step 4) is not thicker than 2 μm; and the hole structure formed in step 5) is distributed surrounding the substrate pattern with diameter of 10-1000 nm.

In the above method, growth rate of quasi two-dimensional growth conditions is preferably not faster than those of the three-dimensional and two-dimensional growth conditions. In some embodiments, growth rate of three-dimensional growth conditions is faster than that of quasi two-dimensional growth conditions. In some embodiments, growth temperature of three-dimensional growth conditions is about 10-50° C. higher than that of quasi two-dimensional growth conditions. In some embodiments, reaction chamber pressure of three-dimensional growth conditions is about 200-300 mbar higher than that of quasi two-dimensional growth conditions. In some embodiments, growth temperature of two-dimensional growth conditions is about 20-100° C. higher than that of three-dimensional growth conditions. In some embodiments, growth rate of two-dimensional growth conditions is about one time to two times of that of three-dimensional growth conditions. In some embodiments, V/III ratio of two-dimensional growth mode is less than about 2 times that of three-dimensional growth conditions.

According to a second aspect of present disclosure, a nitride underlayer, comprising: a pattern substrate with lattice planes of different growth rates; a nitride nucleating layer over the pattern substrate; a first nitride layer with quasi two-dimensional growth over the nucleating layer; a second nitride layer with three-dimensional growth, having a gap with the substrate, over the first nitride layer; a third nitride layer with two-dimensional growth over the second nitride layer, which folds an uncracked plane above the gap to form a hole structure on the nitride underlayer; wherein, the quasi two-dimensional growth refers to that the ratio between horizontal and vertical growth rates is between those of two-dimensional growth and three-dimensional growth conditions.

In some embodiments, the substrate pattern comprises a series of protrusion portions, in circular platform, prism platform, cone, pyramid shapes or their combinations. Preferably, the protrusion part is at least 0.5 µm high with preferred gap larger than 0.01 µm.

In some embodiments, the substrate pattern comprising a series of recess portions is an inverted trapezoidal structure with a tilt side wall.

In the above structure, by controlling thicknesses of the first nitride layer and the second nitride layer, the hole structure size can be adjusted. The thicker the first nitride layer is, the smaller the hole is. Preferably, total thickness of the first and the second nitride layers is similar to that of the substrate pattern with difference not more than 0.5 µm. In some embodiments, the first nitride layer is about 0.1-1.5 µm thick; the second nitride layer is not thicker than 2 µm; and the hole structure is distributed surrounding the substrate pattern with diameter of 10-1000 nm.

According to a third aspect of present disclosure, a nitride underlayer, comprising a pattern substrate with a series of protrusion portions or recess portions over the surface; a nitride nucleating layer over the pattern substrate; a nitride laminated layer over the nucleating layer; a series of mutually-isolated hole structures in sub-micron scale, formed between the nitride laminated layer and the substrate and distributed surrounding the protrusion portions or the recess portions to prevent large hole size from influencing device appearance, crushing resistance and stability.

In the above structure, the hole in sub-micron scale is within the nitride layer material, which avoids impaction on device appearance and contact electrode fabrication. The hole diameter is about 10-1000 nm.

In some embodiments, the protrusion portion or the recess portion appears massive distribution with gap larger than 0.01 µm and size of 0.5-8 µm.

In some embodiments, the substrate pattern is a protrusion portion. Preferably, the protrusion portion top appears platform shape, and included angle between the top lattice plane and that of the non-protrusion portion is less than 5°.

In some embodiments, the substrate pattern is a recess portion, which appears an inverted trapezoidal structure with a tilt side wall, wherein, the lattice growth rate of the side wall is slower than that of the bottom lattice plane.

In some embodiments, the nitride laminated layer comprises: a first nitride layer formed over the nucleating layer under quasi two-dimensional growth conditions; a second nitride layer, having a gap with the substrate, formed over the first nitride layer under three-dimensional growth conditions; a third nitride layer formed over the second nitride layer under two-dimensional growth conditions, which folds an uncracked plane above the gap to form a series of mutually-isolated hole structures on the nitride underlayer; wherein the quasi two-dimensional growth conditions refer to that the ratio between horizontal and vertical growth rates is between those of two-dimensional growth conditions and three-dimensional growth conditions. Preferably, total thickness of the first nitride layer and the second nitride layer is similar to that of the substrate pattern with difference not more than 0.5 µm.

In some embodiments, a circular hole is distributed surrounding each protrusion portion or recess portion. In some embodiments, a series of discrete holes are distributed surrounding each protrusion portion or recess portion.

According to a fourth aspect of present disclosure, a nitride semiconductor photoelectric device, comprising: a pattern substrate; a nitride nucleating layer over the pattern substrate; a nitride laminated layer over the nucleating layer; a series of mutually-isolated hole structures in sub-micron scale between the nitride laminated layer and the substrate and distributed surrounding the protrusion portion or the recess portion; a luminous epitaxial layer over the nitride laminated layer, comprising an n-type semiconductor layer, a luminous layer and a p-type semiconductor layer.

In the above structure, on the one hand, the hole in sub-micron scale is within the nitride layer material, which avoids impaction on device appearance and contact electrode fabrication; and on the other hand, in combination with patterned substrate capable of improving material quality, the fabricated LED has higher photoelectric conversion efficiency.

It is to be understood that in the claims and specification for the present disclosure, the gap of substrate pattern, in general, means the shortest distance between margins of two adjacent patterns (e.g., two protrusion portions).

In the drawings:
001: patterned substrate; 002: substrate pattern; 003: non-protrusion portion of substrate; 100: nitride underlayer; 101: nucleating layer; 102: first nitride layer (quasi two-dimensional layer); 103: second nitride layer (three-dimensional layer); 104: third nitride layer (two-dimensional layer); 105: hole structure; 201: n-type semiconductor layer; 203: luminous layer; 204: p-type semiconductor layer; 301: gap.

DETAILED DESCRIPTION

Light from the active area in the nitride light emitting device is mainly emitted from the p-type or n-type region. Since the refractive index of GaN is about 2.45, a bit different from that of the air, the light extraction efficiency is low. Methods for improving extraction efficiency include: pattern substrate, transparent substrate, distributed Bragg reflector structure, micro surface structure, inverted chip, chip bonding, laser lift-off, etc. Fabrication of micro surface structure, back-coating reflector and bonding process may improve extraction efficiency to some extent, but they also lead to such problems as difficult fabrication of contact electrode and complex fabrication process. Of all successful schemes for improving light extraction, pattern substrate has such advantages as reduction of dislocation density of material by lateral epitaxial technology, improvement of internal quantum efficiency in active area, increase of light reflectivity probability between GaN and substrate, increase external quantum efficiency and photoelectric conversion efficiency of semiconductor light emitting device with light emitted from front surface.

Figure 1:
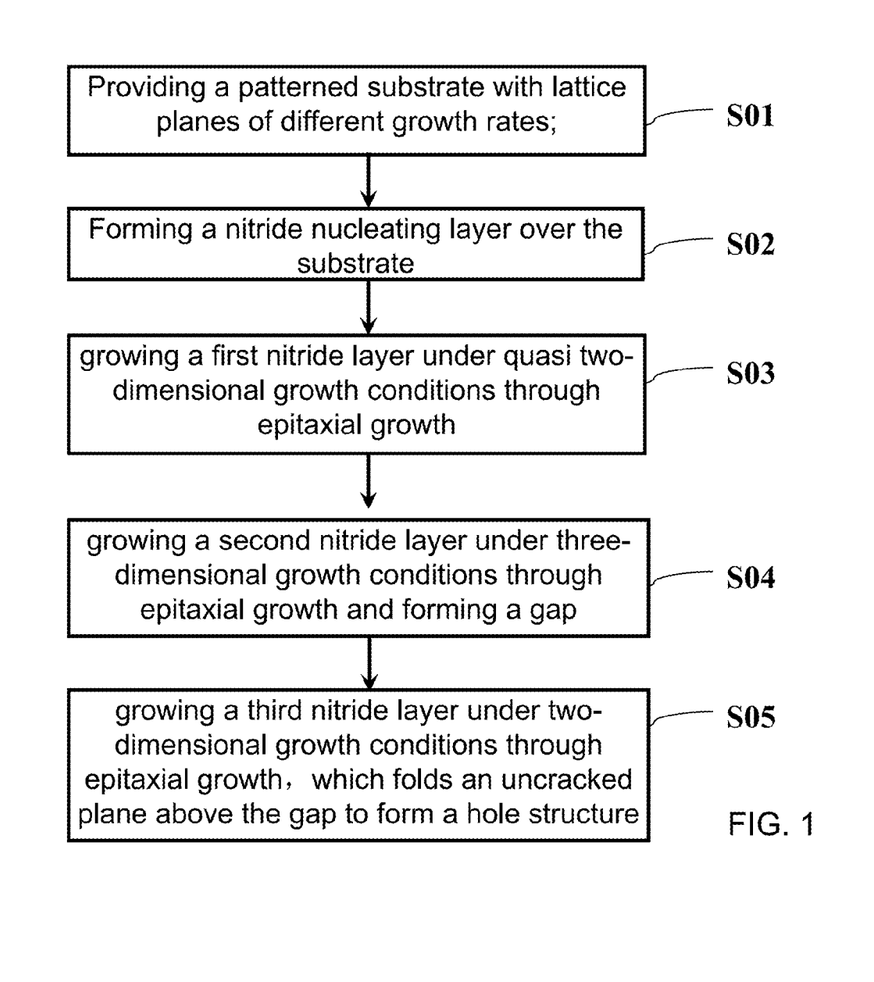
FIG. 1 is a flow chart of a nitride underlayer according to embodiments of present disclosure.

The following embodiments, in combination with a patterned substrate, provide a nitride underlayer and fabrication method thereof that can improve GaN LED extraction efficiency. FIG. 1 gives simple illustration about fabrication method of a nitride underlayer, mainly comprising: S01: providing a patterned substrate with lattice planes of different growth rates; S02: forming a nitride nucleating layer over the substrate; S03: growing a first nitride layer under quasi two-dimensional growth conditions through epitaxial growth; S04: growing a second nitride layer under three-dimensional growth conditions through epitaxial growth; S05: growing a third nitride layer under two-dimensional growth conditions through epitaxial growth.

Specifically, in step SOL the patterned substrate can be sapphire substrate or any other materials suitable for nitride growth, e.g., SiC; the substrate pattern can be a series of discrete protrusion portions or recess portions over the substrate surface; each protrusion portion (or recess portion) is at least 0.5 μm high (deep) with preferred gap more than 0.01 μm. When the substrate pattern is a protrusion portion, it is in circular platform, prism platform, cone, pyramid shapes or their combinations. Preferably, the protrusion portion top appears platform shape, and included angle between the top lattice plane and that of the non-protrusion portion is less than 5°, and relationship of growth rates of different areas of the pattern substrate: non-protrusion portion>protrusion portion top>protrusion portion side wall. When the substrate is a recess portion, the recess portion appears an inverted trapezoidal structure with a tilt side wall, wherein, the lattice growth rate of the side wall is slower than that of the bottom lattice plane.

In steps S03-S05, GaN, AlGaN, aluminum nitride or other nitrides can be used. The growth mode can be adjusted by adjusting such parameters as growth temperature, reaction chamber pressure and VIII ratio. Relationship of growth temperature for three growth modes: quasi two-dimensional growth<three-dimensional growth<two-dimensional growth. Relationship of reaction chamber pressure for three growth modes: reaction chamber pressure of the quasi two-dimensional growth is similar to that of two-dimensional growth, and reaction chamber pressure of the three-dimensional growth is about 200-300 mbar higher than that of the quasi two-dimensional growth conditions. Relationship of growth rate for three growth modes: quasi two-dimensional growth<three-dimensional growth<two-dimensional growth.

Detailed description will be given for the present disclosure with a combination of drawings and embodiments, which shall not restrict the scope of present disclosure.

Embodiment 1

Figure 3:
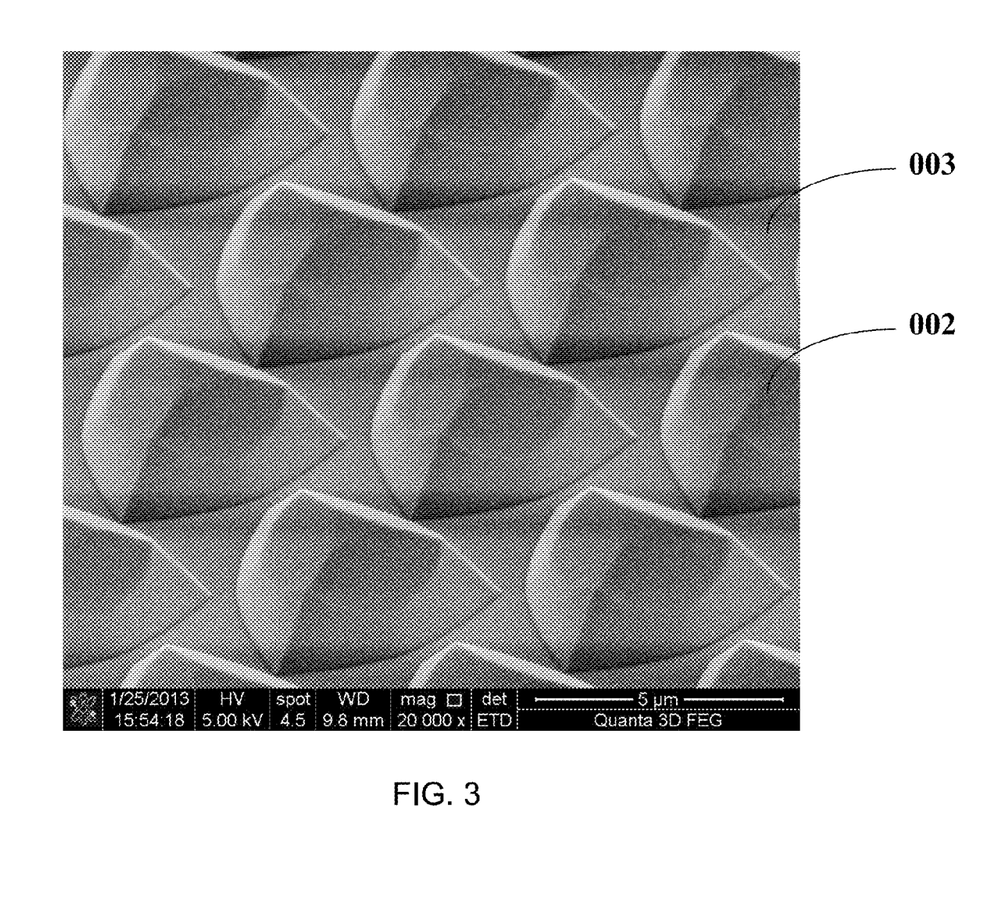
FIG. 3 is a scanning electron microscope drawing of the patterned substrate in Embodiment 1.

A fabrication method for nitride layer, mainly comprising steps (1)-(5) below.
(1) Fabricate a sapphire substrate 001 with different growth rates.
Deposit a $SiO_2$ protection layer over the c-side sapphire substrate surface via plasma enhanced chemical vapor deposition technology (PECVD) and coat photoresist over the $SiO_2$ layer; obtain required pattern on the photoresist with photo etching; under protection of coating photoresist, form corresponding pattern over the $SiO_2$ protection layer through dry ion etching (ICP); under protection of the $SiO_2$ protection layer, heat and corrode the sapphire surface pattern in mixed liquor with 3:1 volume ratio of concentrated sulfuric acid and strong phosphoric acid at 400° C.; fabricate pattern 002 over the plane sapphire surface with wet etching; finally, remove the $SiO_2$ protection layer with BOE and obtain a patterned sapphire substrate 001 grown under nitride layer after surface treatment. FIG. 3 is a scanning electron microscope drawing of the patterned substrate.

(2) Grow a GaN nucleating layer 101.
Put the patterned substrate 001 into metal organic chemical vapor deposition (MOCVD) chamber to change rate of the patterned sapphire substrate into 60 rpm with trimethyl aluminum (TMAl), trimethyl gallium (TMGa) and ammonia ($NH_3$) as Al source, Ga source and N source respectively and $N_2$ as carrier gas. Rise temperature to 300-350° C. and keep stable for about 2 minutes; heat to 1170° C. under hydrogen environment and keep for 10 minutes to remove the surface impurities. Reduce substrate temperature to about 510-540° C.; grow 25 nm GaN nucleating layer at 50 sccm TMGa source flow with $N_2$ as carrier gas and at 24 L/min $NH_3$ flow with reaction chamber pressure as 600 mbar.

(3) Grow a GaN layer as the first nitride layer 102 under quasi two-dimensional growth conditions through epitaxial growth.

Grow the GaN layer in the non-protrusion portion 003 of the patterned substrate 001 under quasi two-dimensional growth conditions. Parameters for quasi two-dimensional growth conditions: reaction chamber pressure: 200 mbar, substrate temperature 960-1020° C., TMGa and $NH_3$ as Ga source and N source respectively, carrier gas: $H_2$, V/III ratio: 1500, growth rate: 1.2 μm/h, and thickness about 0.5 μm.

The nitride layer grown under quasi two-dimensional conditions, which are between three-dimensional and two-dimensional growth, will not form high-density layer-dislocated area; instead, together with pattern substrate, it will provide an island for later three-dimensional growth to achieve dislocation turning and to reduce dislocation density in later growth in combination.

(4) Grow a GaN layer as the second nitride layer 103 under three-dimensional growth conditions through epitaxial growth.

Figure 4:
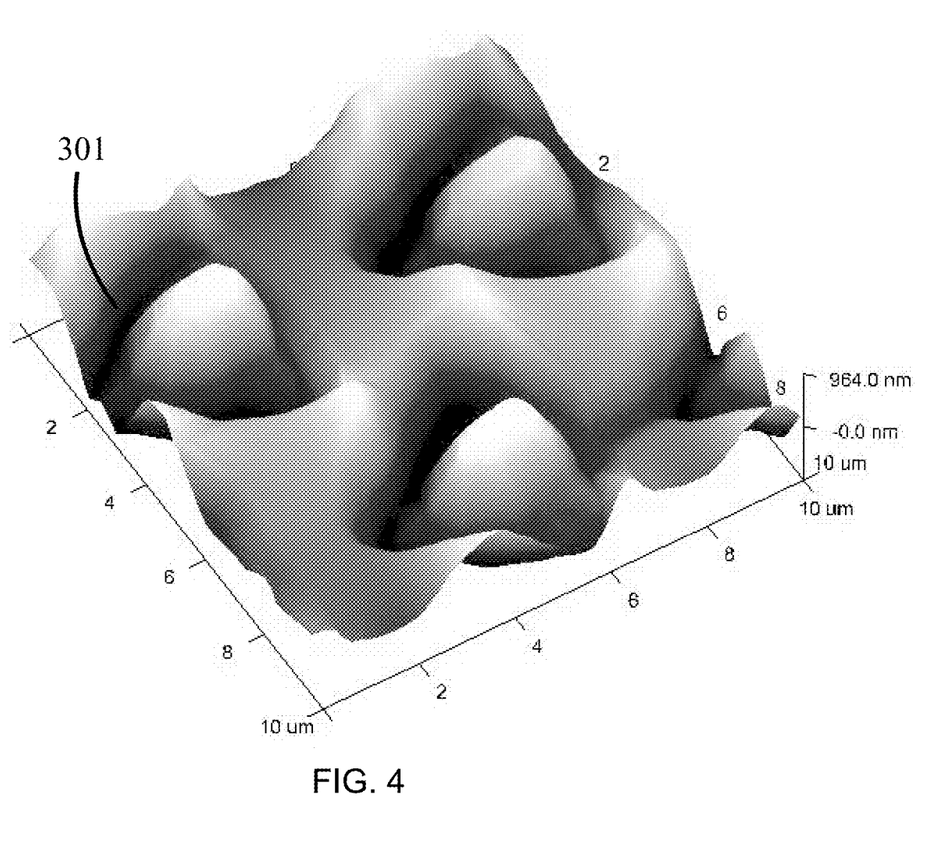
FIG. 4 is a three-dimensional atomic force microscope drawing of the GaN layer under three-dimensional conditions in Embodiment 1.

Grow a GaN layer under three-dimensional growth conditions through epitaxial growth over the first nitride layer 102. Parameters for three-dimensional growth conditions: reaction chamber pressure: 500 mbar, substrate temperature 980-1040° C., TMGa and $NH_3$ as Ga source and N source respective, carrier gas: $H_2$, V/III ratio: 1200, growth rate: 2.3 μm/h, and thickness about 1.3 μm. FIG. 4 is a three-dimensional atomic force microscope drawing of the GaN layer grown under three-dimensional conditions. As shown in the figure, pit, i.e., gap 301 with the substrate, is formed surrounding the protrusion portion.

High-density dislocation ring and hole areas are formed over the nitride layer grown under three-dimensional conditions. The corrosive liquid for later device fabrication may have selective and strong corrosive impacts on these areas if contacted. Inserting of a nitride layer grown under quasi two-dimensional conditions before the three-dimensional layer can separate the three-dimensional layer from the substrate, thus effectively preventing lateral erosion effect from different corrosive liquids in later device fabrication on the substrate and the epitaxial layer.

(5) Grow a u-type GaN layer as the third nitride layer 104 under two-dimensional growth conditions through epitaxial growth.

Figure 5:
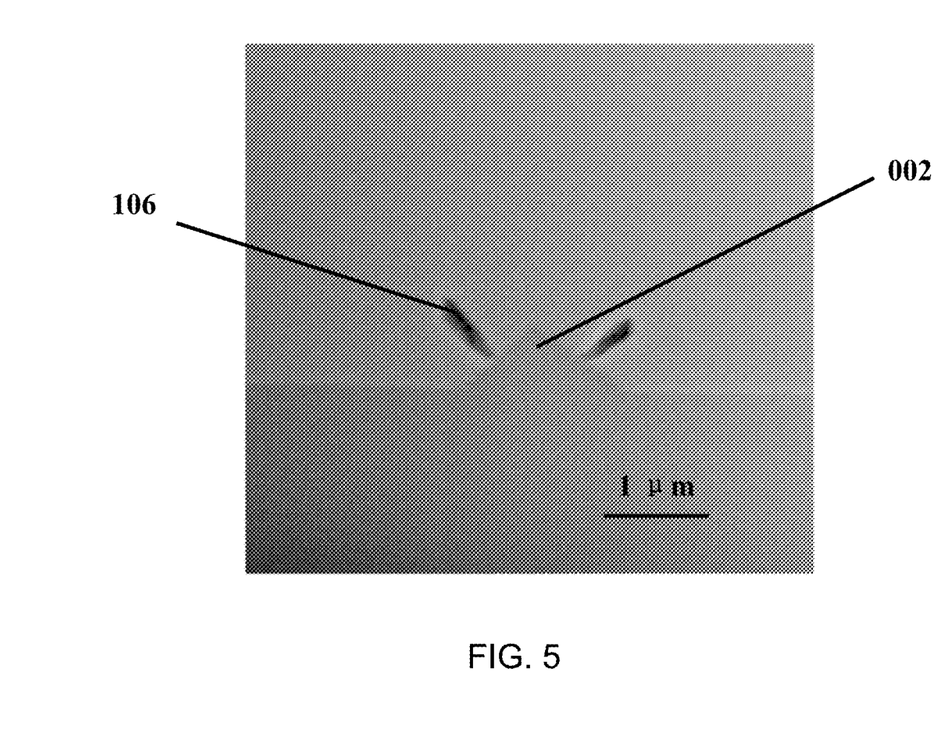
FIG. 5 is a scanning electron microscope section of the hole structure of the nitride underlayer in Embodiment 1.

Continuously grow a third nitride layer over the three-dimensional GaN layer under two-dimensional growth conditions and fold a uncracked plane above the gap to form a hole structure 105 over the nitride underlayer. Parameters for two-dimensional growth conditions: reaction chamber pressure: 200 mbar, substrate temperature 1040-1070° C., TMGa and $NH_3$ as Ga source and N source respectively, carrier gas: $H_2$, V/III ratio: 1300, growth rate: 3.0 μm/h, and growth thickness about 2 μm. An embedded hole structure 105 is formed. FIG. 5 is a scanning electron microscope section of the hole structure of the nitride underlayer in Embodiment 1. The hole structure, less than 1 μm, surrounds substrate patterns. Holes are separated from each other. The advantage of this characteristic is that, in later chip fabrication process, the cutting line can just right to pass through the substrate pattern, which can effectively avoid corrosion effect on inner hole of single chip. However, corrosive liquids may corrode exposed holes.

Figure 2:
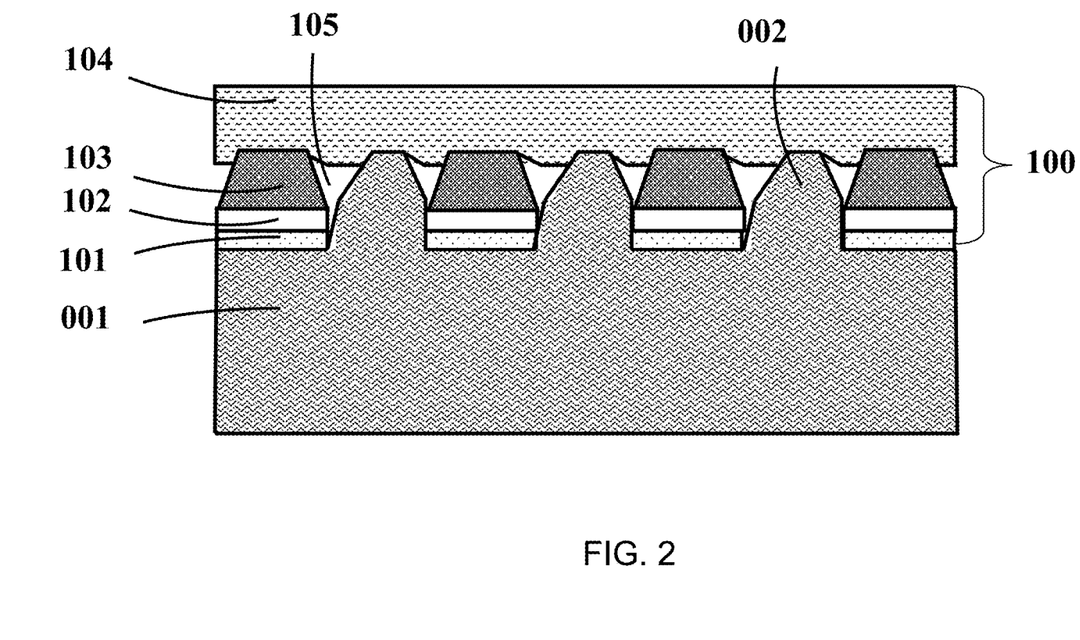
FIG. 2 is a structure diagram of a nitride underlayer according to present disclosure.

FIG. 2 is a structure diagram of the nitride underlayer 100 fabricated by the above method. As shown in the figure, specific structures include patterned substrate 001, nucleating layer 101, and a nitride laminated layer 100 comprising a first nitride layer 102, a second nitride layer 103 and a third nitride layer 104, in which, the pattern 002 of the substrate 001 is about 2.0 μm high with diameters of about 0.5-8 μm. Gap of each protrusion portion, in general, can be 0.01-5 μm, which is 0.3 μm in this embodiment. Total height of the first and the second nitride layers is similar to that of the pattern 002 with difference not more than 0.5 μm generally. In this embodiment, the total height is about 1.8 μm. The hole size can be adjusted by controlling thickness of the first and the second nitride layer. The thicker the first nitride layer is, the smaller the hole is. The first nitride layer is about 0.1-1.5 μm thick. The nitride laminated layer 100 can be made of GaN, aluminum nitride, AlGaN, InGaN, etc. The third nitride layer 104 can be non-doped or n-type doped.

Figure 6:
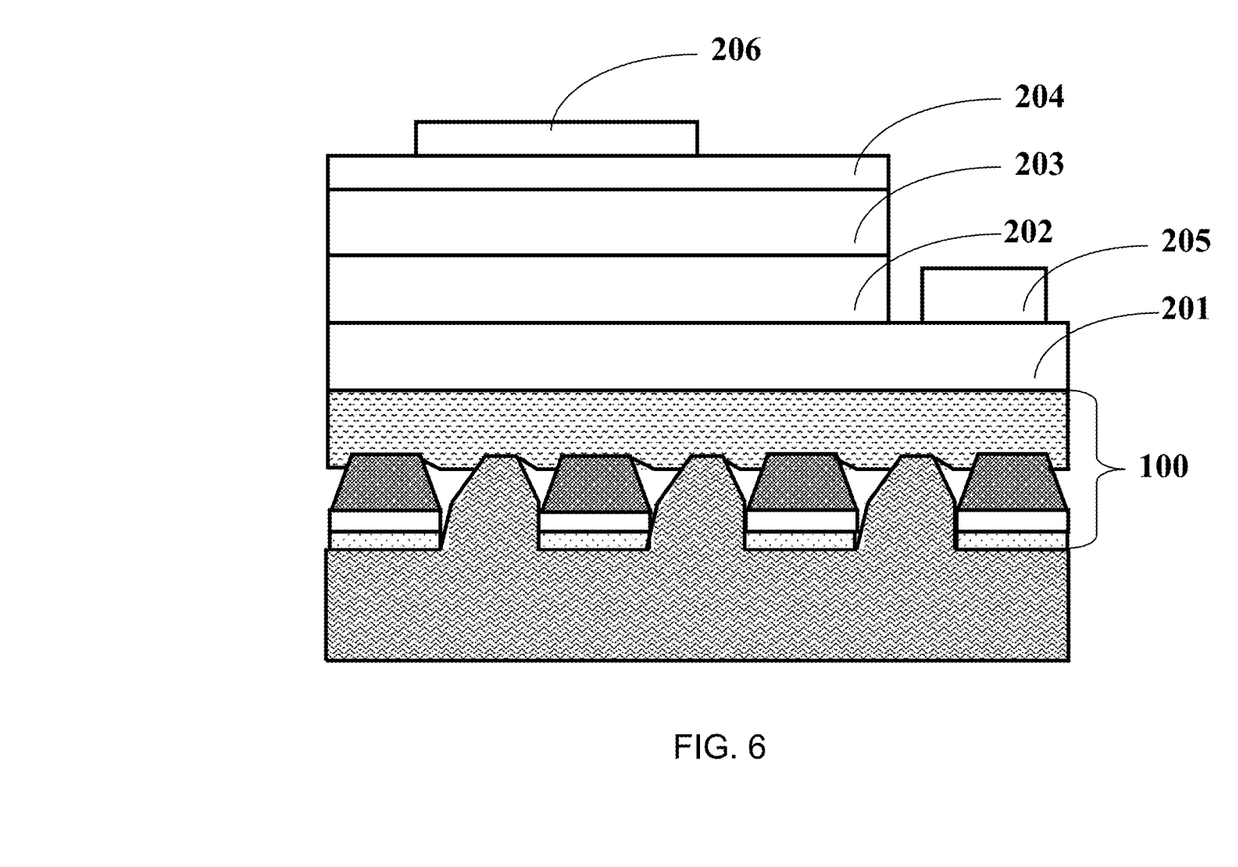
FIG. 6 is a structural diagram of the LED fabricated with the nitride underlayer in Embodiment 1.

With reference to FIG. 6, a nitride LED chip structure fabricated with the aforesaid nitride underlayer 100 with the micro-hole structure 105, comprising an n-type semiconductor layer 201 over the nitride underlayer 100, an active layer 202, a p-type semiconductor layer 203, a current expansion layer 204, an n electrode 205 and a p electrode 206.

In this embodiment, in combination of pattern substrate, form an underlayer with hole structure over the patterned substrate through epitaxial technology and grow GaN-based LED with later MOCVD or MBE epitaxial growth. Taking the patterned sapphire substrate as example, the formed holes are deeply embedded inside the nitride material and formed surrounding the pattern of sapphire substrate. Since refractive index of gas inside the hole is about 1, less than that of the sapphire (1.78), refractivity between the GaN and gas interface surrounding the holes is higher than that between the sapphire substrate and the GaN interface. In this way, the light emitted to hole parts has higher probability to be reflected back to the device surface for emitting, thus improving extraction efficiency.

Further, the nitride underlayer 100, similar to pattern substrate, can also improve material quality; the hole in sub-micron scale is formed within the material, which prevents large hole size from influencing device appearance, crushing resistance and stability and makes it easier for later device fabrication.

Embodiment 2

Difference of this embodiment from Embodiment 1 lies in that: the substrate pattern is a series of recess portions over the surface. Specifically, the recess portion appears an inverted trapezoidal structure with a tilt side wall, wherein, the lattice growth rate of the side wall is slower than that of the bottom lattice plane. A first nitride layer through quasi two-dimensional growth, a second nitride layer through three-dimensional growth and a third nitride layer through two-dimensional growth are formed over the recess portion bottom in successive, wherein, the recess portion is at least 0.5 μm deep with preferred gap of 0.01-5 μm and diameter 0.5-8 μm.

Embodiment 3

Figure 7:
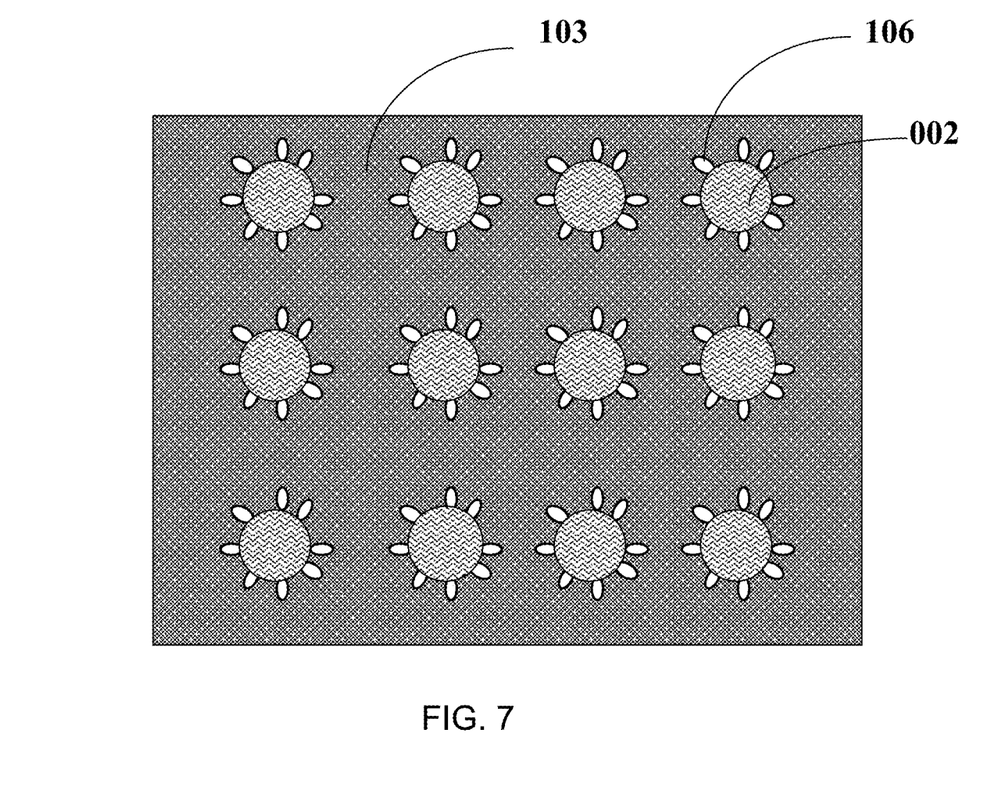
FIG. 7 is a schematic diagram of the hole structure within the nitride underlayer structure in Embodiment 1.
Figure 8:
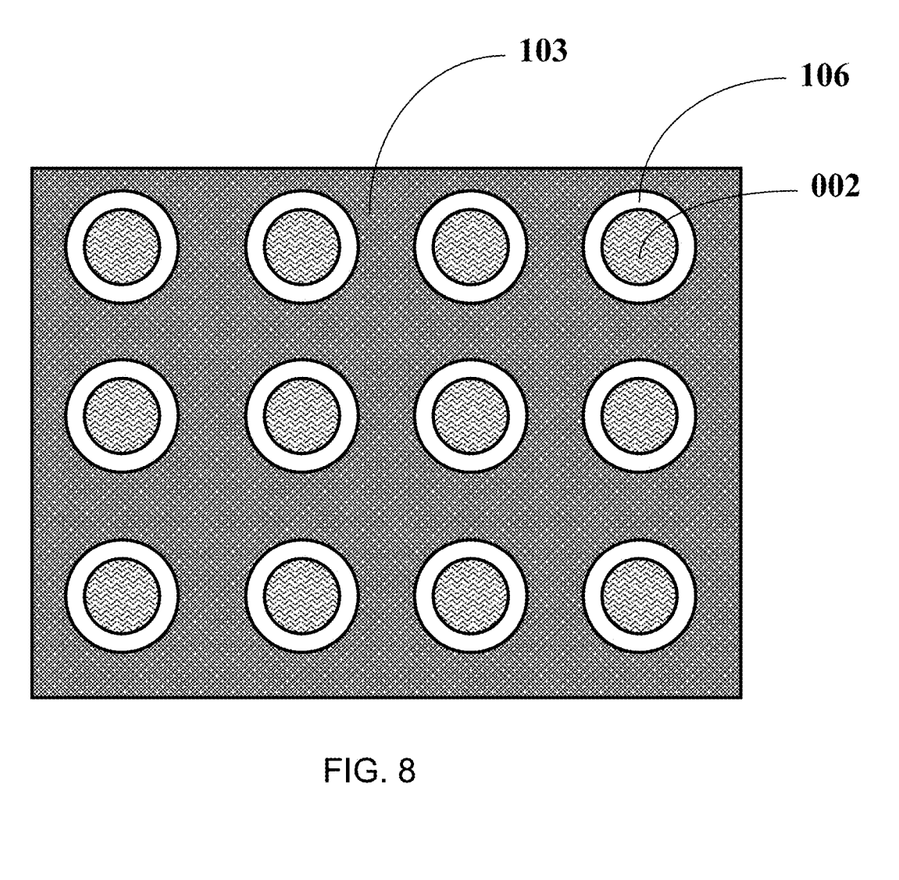
FIG. 8 is a schematic diagram of the hole structure within the nitride underlayer structure in Embodiment 2.

Difference of this embodiment from Embodiment 1 lies in that: with references to FIGS. 7 and 8, in Embodiment 1, a series of discontinuous yet non-strictly periodic small holes 105 are distributed surrounding each protrusion portion 002; and in this embodiment, a basically-circular hole 105 is distributed surrounding each protrusion portion 002. The small holes in Embodiment 1, if enlarged till mutually connected to each other, will form a circular hole. Compared with discontinuous holes, the circular hole can further improve the reflectivity probability of internal light of device and extraction efficiency.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A nitride underlayer fabrication method, comprising:
   providing a patterned substrate with lattice planes of different growth rates;
   growing a nitride nucleating layer over the pattern substrate;
   forming a first nitride layer under quasi two-dimensional growth conditions over the nitride nucleating layer;
   forming a second nitride layer over the first nitride layer under three-dimensional growth conditions, wherein a gap is formed between the second nitride layer and the substrate;
   growing a third nitride layer, which forms a surface over the gap to thereby form a hole structure over the nitride underlayer;
   wherein, the quasi two-dimensional growth conditions include a ratio between horizontal and vertical growth rates being between those of two-dimensional growth conditions and three-dimensional growth conditions.

2. The method of claim 1, the first nitride layer is configured to prevent lateral erosion by corrosive fluids on the substrate or an epitaxial layer during later device fabrication processes.

3. The method of claim 1, further comprising controlling thicknesses of the first nitride layer and the second nitride layer to thereby adjust a size of the hole structure size.

4. The method of claim 1, wherein the patterned substrate has a protrusion portion with a top having a plateau shape, and wherein an angle between a lattice plane of the top and a lattice plane of a non-protrusion portion is less than 5°.

5. The method of claim 1, wherein a growth temperature of the three-dimensional growth conditions is about 10-50° C. higher than that of the quasi two-dimensional growth conditions.

6. The method of claim 1, wherein a reaction chamber pressure of the three-dimensional growth conditions is about 200-300 mbar higher than that of the quasi two-dimensional growth conditions.

7. The method of claim 1, wherein a growth rate of the three-dimensional growth conditions is higher than that of the quasi two-dimensional growth conditions.

8. The method of claim 1, wherein a growth temperature of the two-dimensional growth conditions is about 20-100° C. higher than that of the three-dimensional growth conditions.

9. The method of claim 1, wherein a growth rate of two-dimensional growth conditions is higher than that of the three-dimensional growth conditions.

10. The method of claim 1, wherein a V/III ratio of the two-dimensional growth mode is less than about 2 times that of the three-dimensional growth conditions.

11. A nitride underlayer structure, comprising:
a patterned substrate with lattice planes of different growth rates;
a nitride nucleating layer over the patterned substrate;
a first nitride layer with quasi two-dimensional growth over the nucleating layer;
a second nitride layer with three-dimensional growth over the first nitride layer, having a gap with the substrate;
a third nitride layer with two-dimensional growth over the second nitride layer, which folds an uncracked plane over the gap to form a hole structure on the nitride underlayer;
wherein, the quasi two-dimensional growth refers to that a ratio between horizontal and vertical growth rates is between those of the two-dimensional growth and the three-dimensional growth.

12. The nitride underlayer structure of claim 11, wherein the substrate pattern comprises a series of protrusion portions or recess portions; and
wherein the hole structure is distributed surrounding the protrusion portions or the recess portions.

13. The nitride underlayer structure of claim 12 wherein the protrusion portion or the recess portion is at least 0.5 µm high with a gap larger than 0.01 µm.

14. The nitride underlayer structure of claim 12, wherein: the hole structure has a diameter of about 10-1000 nm.

15. The nitride underlayer structure of claim 11, wherein the first nitride layer has a thickness of about 0.1-1.5 µm; and the second GaN layer has a thickness of 2 µm or less.

16. The nitride underlayer structure of claim 11, wherein a total thickness of the first and the second nitride layers is similar to that of the substrate pattern with a difference no more than 0.5 µm.

17. A nitride underlayer structure, comprising:
a nitride underlayer, comprising a pattern substrate with a series of protrusion portions or recess portions over the surface;
a nitride nucleating layer over the pattern substrate;
a nitride laminated layer over the nucleating layer;
a series of mutually-isolated hole structures between the nitride laminated layer and the substrate;
wherein the hole structures are in a sub-micron scale, and are distributed surrounding the protrusion portions or the recess portions to prevent large hole size from affecting device appearance, crush resistance, and stability; and
wherein a series of discrete holes are distributed surrounding each protrusion portion or recess portion; wherein the nitride laminated layer comprises:
a first nitride layer formed over the nucleating layer under quasi two-dimensional growth conditions;
a second nitride layer, having a gap with the substrate, formed over the first nitride layer under three-dimensional growth conditions;
a third nitride layer formed over the second nitride layer under two-dimensional growth conditions, which folds an uncracked plane above the gap to form a series of mutually-isolated hole structures on the nitride underlayer;
wherein, the quasi two-dimensional growth conditions refer to that the ratio between horizontal and vertical growth rates is between those of two-dimensional growth conditions and three-dimensional growth conditions.

18. The nitride underlayer structure of claim 17, wherein the protrusion portions or the recess portions have a block distribution with a gap of about 0.01-5 µm and a size of 0.5-8 µm.

19. The nitride underlayer structure of claim 17, wherein if the substrate pattern is a protrusion portion, the protrusion portion has a top with a plateau shape, and an angle between a lattice plane of the and a lattice plane of a non-protrusion portion is less than 5°; and if the substrate pattern is a recess portion, the recess portion has an inverted trapezoidal structure with a tilt side wall, and a lattice growth rate of the side wall is smaller than that of the bottom lattice plane.

* * * * *